United States Patent [19]

Tyson et al.

[11] Patent Number: 5,145,802
[45] Date of Patent: Sep. 8, 1992

[54] METHOD OF MAKING SOI CIRCUIT WITH BURIED CONNECTORS

[75] Inventors: Scott M. Tyson; Richard L. Woodruff, both of Colorado Springs, Colo.

[73] Assignee: United Technologies Corporation, Hartford, Conn.

[21] Appl. No.: 790,796

[22] Filed: Nov. 12, 1991

[51] Int. Cl.⁵ .............................................. H01L 21/76
[52] U.S. Cl. ........................................ 437/63; 437/61; 437/62; 437/69; 437/70; 437/26
[58] Field of Search ................... 437/61, 62, 69, 70, 437/244, 63, 26

[56] References Cited

U.S. PATENT DOCUMENTS

| | | | |
|---|---|---|---|
| 4,523,963 | 6/1985 | Ohta et al. | 437/62 |
| 4,778,775 | 10/1988 | Tzeng | 437/26 |
| 4,948,742 | 8/1990 | Nishimura et al. | 437/62 |

FOREIGN PATENT DOCUMENTS

| | | | |
|---|---|---|---|
| 0011642 | 1/1984 | Japan | 437/62 |
| 0206162 | 8/1990 | Japan | 437/61 |

*Primary Examiner*—Brian E. Hearn
*Assistant Examiner*—Trung Dang
*Attorney, Agent, or Firm*—Eric W. Petraske; Richard H. Kosakowski

[57] ABSTRACT

An SOI circuit includes a set of buried body ties that provide ohmic contact to the otherwise floating transistor bodies disposed on an insulating layer and both provide a path for holes generated by impact ionization and also act as a potential shield between the substrate potential and the transistor sources. The same fabrication technique provides a buried interconnect layer between transistors that can be employed as a mask programmable local interconnect in an ASIC such as a gate array. The process provides for independent control of differential mesa thickness and buried body tie thickness, so that fully and partially depleted transistors can be fabricated simultaneously and placed on appropriate mesas without affecting the body ties.

18 Claims, 5 Drawing Sheets

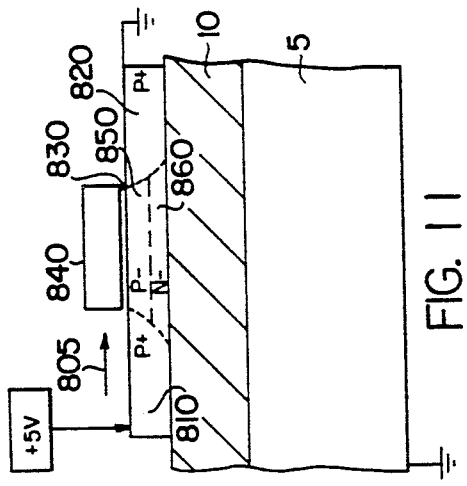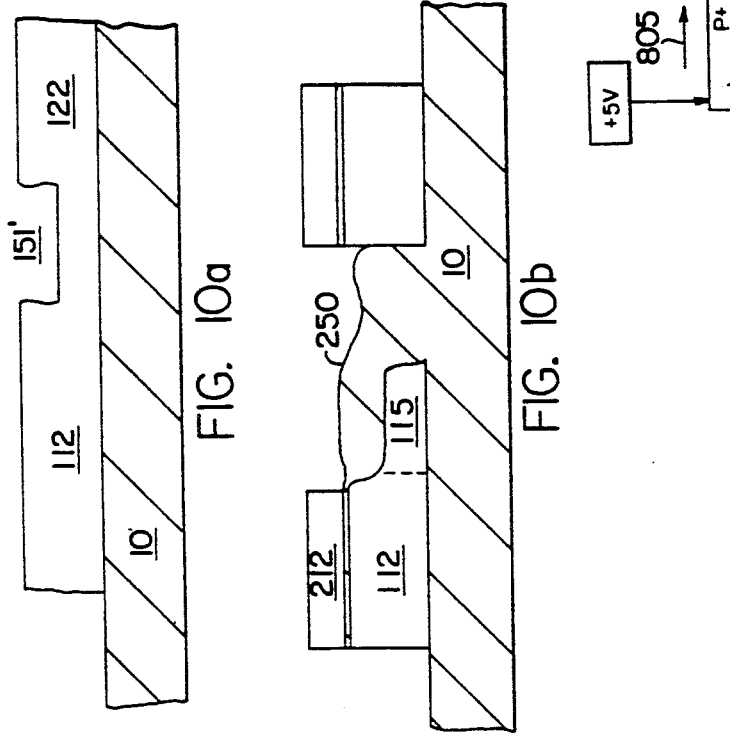

METHOD OF MAKING SOI CIRCUIT WITH BURIED CONNECTORS

DESCRIPTION

1. Technical Field

The field of the invention is that of integrated circuit processing in which a silicon substrate has a buried insulating layer across the wafer above which a top device layer of silicon holds the circuit components. This field is referred to as (SOI) silicon on insulator.

2. Background Art

The advantages with respect to speed of operation of SOI technology compared with bulk silicon technology are well known. A disadvantage in prior art SOI circuits is that N-channel transistors suffer from a phenomenon associated with impact ionization. When an electron-hole pair is formed by ionization of a lattice atom by an electron, a hole is created that migrates towards the source of the transistor. In bulk technology, this was not a problem, because the holes were attracted towards the substrate and away from the transistor. In SOI technology, this cannot happen and therefore the holes are preferentially attracted toward the source.

Prior art SOI technology has used an ohmic connection to the body, the region underneath the channel. Holes are then attracted to a ground connection through this body tie. Such body ties in the prior art have consumed an excessive amount of silicon real estate, resulting in a lower packing density than is desired.

An example of the art is U.S. Pat. No. 4,489,339, in which a body tie having the full thickness of the mesa and a vertically uniform and horizontally discontinuous doping concentration is used to form a conductive connection between the transistor body and a voltage terminal.

DISCLOSURE OF INVENTION

The invention relates to an improved SOI integrated circuit in which contact is provided to the body ( the region beneath the channel ) of N-channel or P-channel transistors by means of a doped silicon layer (buried body tie) that extends beneath the channel of the transistor. This layer is at the bottom edge of the device layer of silicon, next to the buried insulating layer.

A feature of the invention is maintaining the body of a P-channel transistor at the same potential as the source.

Another feature of the invention is the provision of another layer of interconnections buried beneath the plane defined by the closest mesas.

Yet another feature of the invention is the ability to provide different thicknesses for the nFET channel region, the pFET channel region, and the buried body ties.

Yet another feature of the invention is the fabrication of a mixture of fully depleted and partially depleted transistors simultaneously.

BRIEF DESCRIPTION OF DRAWINGS

FIG. 7 illustrates a top view of a pair of transistors showing the use of an interconnection.

FIG. 8 illustrates a cross section through FIG. 7.

FIGS. 10a and 10b illustrate an alternative method of forming the buried connectors.

FIG. 11 illustrates a P-channel transistor employing the invention.

BEST MODE OF CARRYING OUT THE INVENTION

Figure 1:
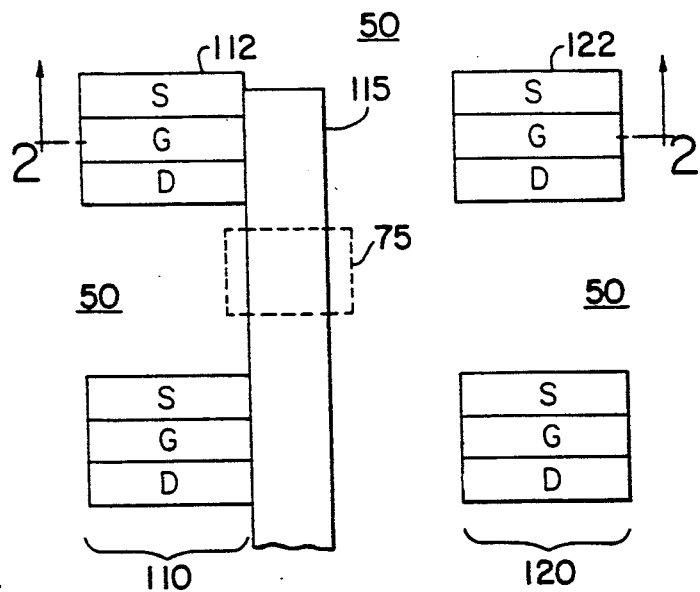
FIG. 1 illustrates a top view of a portion of an integrated circuit constructed according to the invention.
Figure 2A:
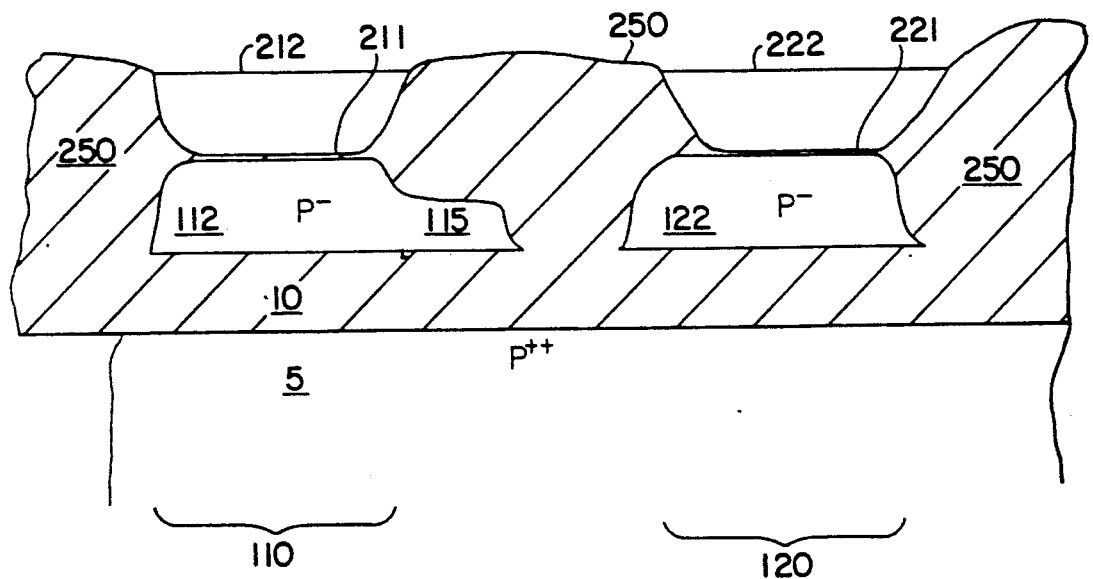
FIGS. 2a and 2b illustrate cross sections through FIG. 1.

Referring now to FIG. 1, there is shown a top view of a portion of an SOI integrated circuit with a column of N-channel (P-well) transistors on the left, denoted generally by the numeral 110, and a column of P-channel (N-well) transistors on the right, denoted generally by the numeral 120. The transistors are formed in silicon mesas 112, 114, 122, 124, etc. and have a source, a drain and a gate denoted by the capital letters S, G and D. The area between transistors, referred to as the field, or the field area, is denoted by the numeral 50 and consists of a LOCOS oxide that extends down to the buried oxide layer, or to the buried body tie as may be the case, that is formed over the whole wafer. A buried silicon connector used as a buried body tie 115 is shown as extending along the right side of transistors 112 and 114 in column 110. A cross section 2—2 through transistors 112 and 122 in FIG. 1 is shown in FIG. 2a. Substrate 5 is on the bottom of the Figure with buried insulator 10 above it. Illustratively, insulator 10 is a layer of silicon oxide formed according to a known process in a commercially available wafer, such as that available from the IBIS corporation of Danvers, MA. The buried insulator 10 is illustratively an implanted buried oxide, but a nitride, sapphire or other insulating layer could be used. Preferably the insulating layer is formed by multiple steps of oxygen implantation and annealing, since that process produces less damage in device layer 20. Two transistor mesas denoted by 112 and 122 are shown in cross section. Mesa 112 has an extension 115 which is the buried body tie. Conventional gate oxides 211 and 221 and conventional gates 212 and 222 complete the transistors. The transistors are separated by a LOCOS oxide denoted by the numeral 250.

The transistors according to the invention are formed in silicon mesas that are isolated by an oxide layer formed with a triple nitride process. A first sacrificial LOCOS oxide is grown in a first area that will be the thinner of the two types of mesa (illustratively pFETs) and the field region between the circuit devices (to a nominal thickness of about 1900 Å). This oxide is removed and a second oxide is grown over an isolation region within the field region, after which the final LOCOS oxide is grown over the entire field area of the circuit to a depth that extends from the surface down to define the thickness of the buried body tie in the non-thinned region. In a third oxidation step, a third nitride is deposited over the second nitride and patterned to expose the field isolation regions. A final LOCOS is then grown to make contact with the buried insulating layer in the isolation region while the combination of the patterned second and third nitride layers protects all the device regions and buried body tie regions from the field isolation oxidation. As a result, the silicon areas within the field area that were protected by the third nitride in the third LOCOS step have a layer of silicon (having a nominal thickness of 400 to 1500 Å) buried beneath the field oxide.

Figure 2B:
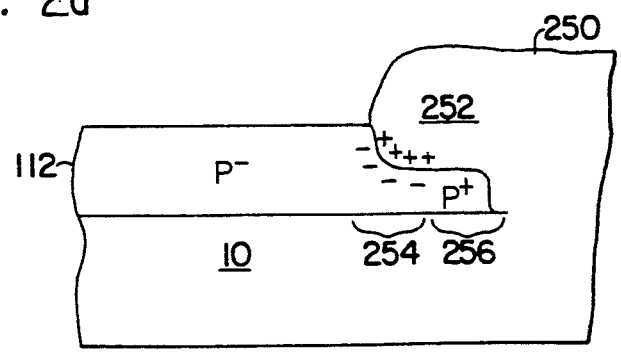

The particular process employed in the illustrative embodiment forms surface N-channel and buried P-channel transistors, so that the doping below the gate oxide is P$^-$ for N-channel transistor 112 and also P. for P-channel transistor 122. If only surface channel transistors were used, the doping below the gate of P-channel transistor 122 would be N$^-$. The doping for the buried body tie 115 is P to P$^+$ in order to provide a low resistance path. FIG. 2b shows an enlarged portion of FIG. 2a, in which bracket 254 indicates the extent of a "sidewall" implant that raises the inversion threshold and increases the conductivity of the area 252 where the curved lower edge of oxide 250 meets mesa 112 under the transistor gate. Bracket 256 indicates the width of the heavily doped portion of connector 115. N-channel mesa 112 is illustratively doped with a P$^-$ threshold adjustment dose of $1.2 \times 10^-$ at 55 keV (as is conventional, the /cm$^2$ is omitted in specifying doses) to give a concentration of about $2 \times 10^{17}$/cm$^3$ in the channel and buried connector 115 is doped P$^+$ with a boron dose of $1 \times 10^{16}$ at 75 keV. The buried body tie implant voltage is selected to penetrate a nominal thickness of 2500 Å of oxide to place the peak of the P-dopant concentration at the center of a buried body tie having a nominal thickness of 600Å. The transition region 252 is doped with two doses of boron at $3 \times 10^{13}$ at 60 keV and $2 \times 10^{13}$ at 80 keV to raise the inversion threshold of the silicon oxide interface above the transistor threshold to a nominal value of about 1.5 V in the active device region where the LOCOS meets the gate oxide. The P-channel transistors have a shallow threshold adjustment boron implant of $7 \times 10^{11}$ at 25 keV. A deeper "well" implant is not used, nor is a sidewall implant since the effect of stray charge from radiation is to raise the threshold of the P-channel transistors. A sidewall implant may be used on the P-channel device to improve conductivity between the buried body tie and the body. Those skilled in the art will readily be able to adjust the implant voltage to accommodate different mesa thicknesses.

It will be evident to those skilled in the art that holes formed in the channel of transistor 112 can travel through buried body tie 115 to a ground contact that can be made at any convenient portion of buried body tie 115 such as that indicated in FIG. 1 by the dotted box labeled 75, or the buried body tie can be routed to the nearest grounded transistor source. Both transistors and the power supply connection or terminal 75 will be referred to as elements of the circuit, as are diodes, resistors, capacitors, etc. The use of a buried conducting layer of silicon permits the body tie to be made with less use of silicon real estate than was required of body ties used in the prior art of bulk silicon.

Figure 3A:
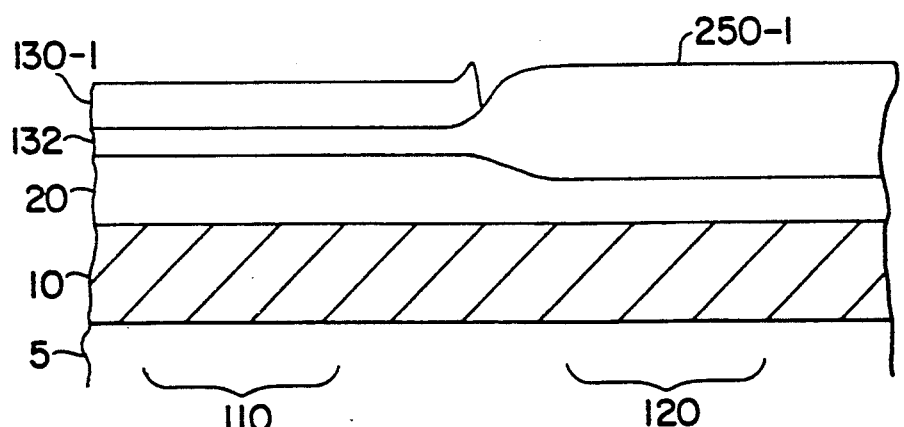
FIGS. 3a and 3b illustrate the first and second steps of oxidation according to the process.
Figure 3B:
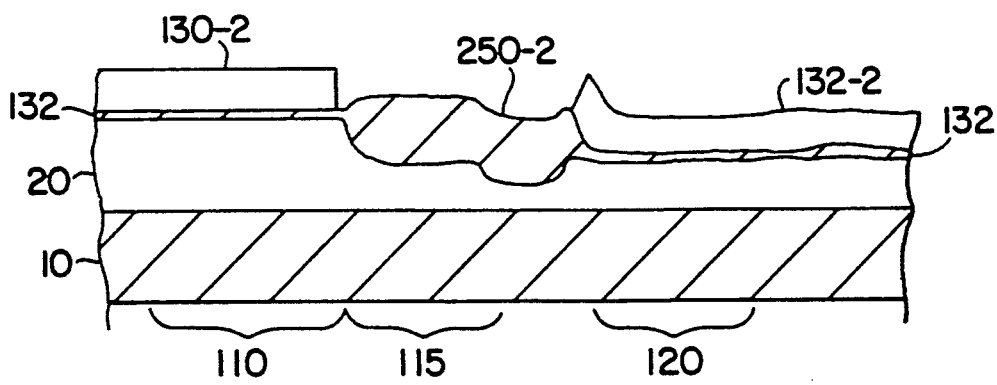

Referring now to FIG. 3A, there is shown the step of forming the first LOCOS oxide. After conventional preparation steps including formation of pad oxide 132, a set of nitride layers 130-1 is formed over the sites in device layer 20 of silicon that will become the N-channel mesas (112, 114, etc.) shown in FIG. 1. Two brackets labeled 110 and 120 show the bounds of the future columns that will be formed. The provide for a differential mesa thickness. LOCOS oxide 250-1 reduces the thickness of layer 20 above the site of the P-channel transistors and also over what will become the isolation region. This oxide and nitride is stripped and a second LOCOS step is performed, as shown in FIG. 3B. An area of LOCOS oxide labeled 250-2 is shown as being formed and extending into device layer 20. The thickness of this oxide will determine the thickness of the final body tie is the area denoted by bracket 115. These first oxide steps are those that will define the area in which the isolation oxide extends all the way down to buried insulator 10, referred to as the isolation area and also the total field area between mesas including the connectors, referred to as the field area.

Figure 4:
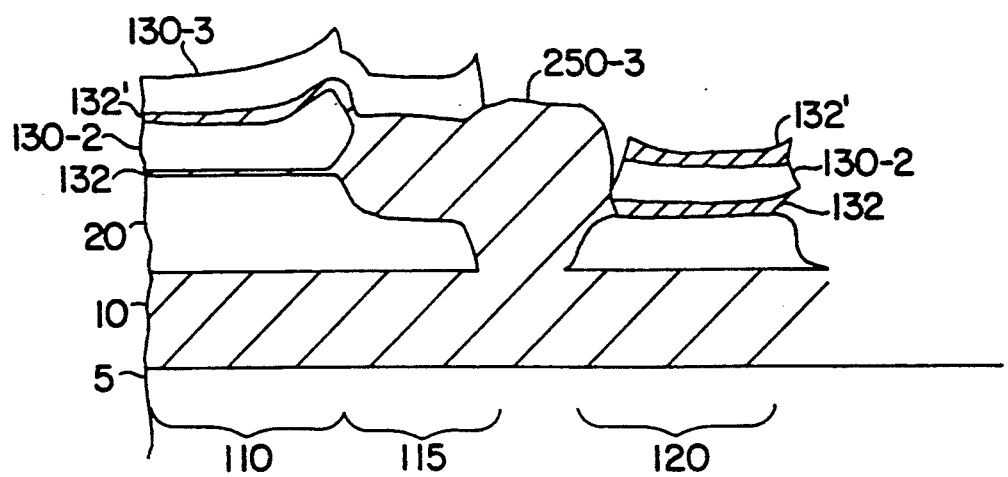
FIG. 4 illustrates the third step of oxidation according to the process.

FIG. 4 shows the third oxide step. The second oxide layer 250-2 remains, together with the second layer of nitride 130-2. A third layer of nitride 130-3 that has a different geometrical area has been put down. As can be seen in looking at the bracket labeled 110, the third nitride 130-3 blocks previously exposed areas over the buried body tie 115. The third nitride in this Figure extends past the second nitride by an amount equivalent to the width of the buried body tie 115 that is to be formed.

As oxide 250-3 is formed, it grows downwardly towards buried layer 10. In the area where the first oxide 250-1 is exposed, top layer 20 is thinner than elsewhere and the isolation oxide will be readily extended through additional oxidation to the buried oxide layer. Therefore, when oxide 250 has reached buried oxide 10 (with some tolerance to compensate for process variations), there is a thin portion of unoxidized silicon 115 under the field LOCOS (grown in the second oxidation step) in the area that was protected in the third oxidation step.

The depth of oxide 250-2 and the time and tolerance for oxide 250-3 are set, as will be evident to those skilled in the art, to leave an amount of buried silicon 115 that has a nominal thickness of about or greater than 400 Å. In the embodiment illustrated, the initial thickness of silicon layer 20 was 2000 Å. Those skilled in the art will easily be able to devise parameters to compensate for initial silicon layers of different thickness.

Figure 5:
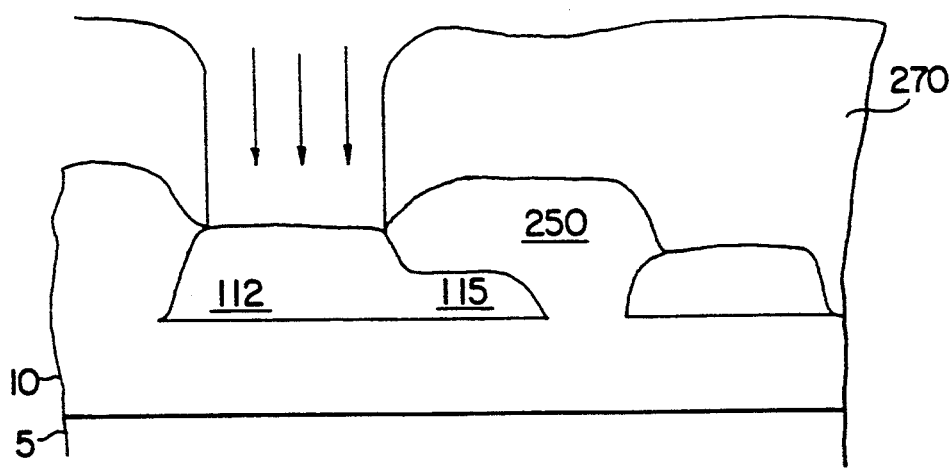
FIG. 5 illustrates a cross sectional view of the same area of the circuit as FIG. 1 showing the P-well implant step.

The buried body tie must be doped sufficiently to have a high conductivity while avoiding junction breakdown voltages to the N$^+$ sources and drains of less than 8 volts. Referring now to FIG. 5, a P-well implant according to the invention is performed to set well doping and the inversion threshold simultaneously. Silicon layer 20 has been formed initially undoped or with a standard P$^-$ doping of conventional magnitude (about $5 \times 10^{14}$/cm$^3$). In general, a mesa may have both a "well" implant and a threshold adjustment implant. In the particular process illustrated here, an N-well implant is not used ( so that mesas 120 are covered by photoresist 270 during the P-well implant) and there is a boron P-channel implant in mesa 122 of $7 \times 10^{11}$ at 25 keV in another step not illustrated. The N-channel threshold adjustment of $1.2 \times 10^{13}$ at 55 keV for the N-channel is provided by the P-well implant in this process. If a thicker mesa were used, a threshold adjust implant would be appropriate. The well implant could cover less than the entire mesa, of course, if desired.

Figure 6:
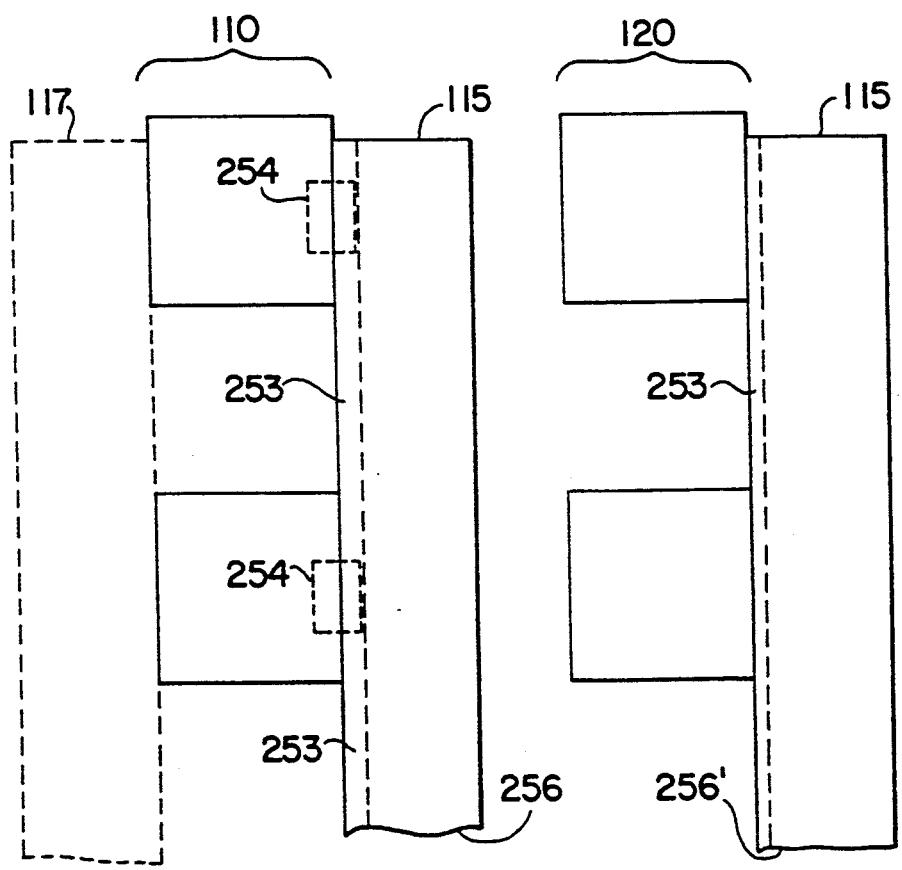
FIG. 6 illustrates a second masking step covering the implantation of the buried layer.

Referring now to FIG. 6, there is shown a second implant, referred to as the sidewall implant, in which the areas 254 in the bird's beak LOCOS sidewalls are implanted with a boron dose for the N-channel transistors. Two doses are used, one of $3 \times 10^{13}$ at 60 keV and another of $2 \times 10^{13}$ at 80 keV in order to ensure coverage in the vertical direction. This implant is to suppress leakage between source and drain at the silicon oxide interface by raising the inversion threshold for parasitic transistors in this area. The areas of the sidewall implants extend a nominal 0.5 micron on either side of the interface. A sidewall dose is not required for the P-channel transistors, unless used to improve the conductivity between the buried body tie and the body, since trapped charge raises the threshold for P-channel transistors. An optional buried body tie 117 is shown on the left of column 110. This option gives improved "snapback" performance for wide transistors.

Areas 256 and 256' (that part of body tie 115 and 115' outside areas 254) are implanted at a voltage of 75 keV to drive through the nominal thickness of the field oxide 250 of 2500 Å and reach down to dope buried connector 115. The magnitude of this connector implant is at least that of a P+ implant ($1.5 \times 10^{15}/cm^2$) and is preferably a higher magnitude of 1 to $1.5 \times 10^{16}/cm^2$ in order to provide a low resistivity in buried connector 115. The dotted area 253 of tie 115 is undoped, relying on the high resistivity of the wafer material to isolate P+ tie 115 from the N+ sources and drains that are adjacent to it. Tie 256' is also doped P+, since the P-channel transistors also have boron body-doping in this process, but will be doped N+ in the event that a true N-well is employed.

The remainder of the process steps in forming the invention are illustrated in Table I showing in conventional style the various major process steps that go into the integrated circuit. As is conventional, stripping of old layers and patterning steps are omitted from the table.

It is not essential that a LOCOS process be used for all steps in forming the buried body tie and other methods may be used as well. FIG. 10a is a counterpart to FIG. 2a, showing a cross section through mesas 112 and 122, positioned on buried oxide layer 10 above substrate 5. A trench 151 is etched by either a wet or dry process and the first silicon removal step. A first LOCOS step forms the isolation oxide 250 connecting to the buried insulator 10. The separation of mesa 112 and connector 115 is indicated with a dotted line. In this embodiment, the initial LOCOS step is replaced by an etch step performed in the field oxide isolation regions.

An additional benefit of this invention is that the buried layer 115 can be used to connect two transistors as well as forming a buried body tie. Referring now to FIG. 7, there is shown a top view of an inverter in which a mesa 112 and a mesa 122 constructed as before are to be connected by a connector 242 to form a conventional inverter. The N-channel transistor on mesa 112 has a buried body tie 15 constructed as before. Buried connector 242 is formed by the same process and at the same time as buried body tie 115 and it extends between mesas 112 and 122. The P+ implant of the source of the P-channel transistor of mesa 122 extends through connector 242 into the bottom edge of mesa 112 to a boundary indicated by line 251. This results in a P-N junction in the drain of the transistor of mesa 122. This junction is shorted out by formation of a self-aligned silicide film (salicide) 252 extending over the drain on mesa 122. The silicide is formed by a conventional process, well known to those skilled in the art. A connector 232, which may be either a polysilicon or a metal connector, extends across oxide 250 in the region between mesas 112 and 122, illustrating the advantage of having this interconnection 242 buried down on the bottom of the epitaxial layer.

Referring now to FIG. 8, there is shown a cross section according to B—B in FIG. 7. Mesa 112 is on the left with gate 212 above a conventional gate oxide. Mesa 122 is on the right. Layer 242 extends from mesa 122 across to mesa 112 with the P+ doping of the source and drain of mesa 122. It extends toward a boundary on mesa 112 and is shorted out by salicide 252 as described above. Those skilled in the art will appreciate that the N+ electrode of transistor 112 could alternatively be extended to the electrode of transistor 122.

Figure 9:
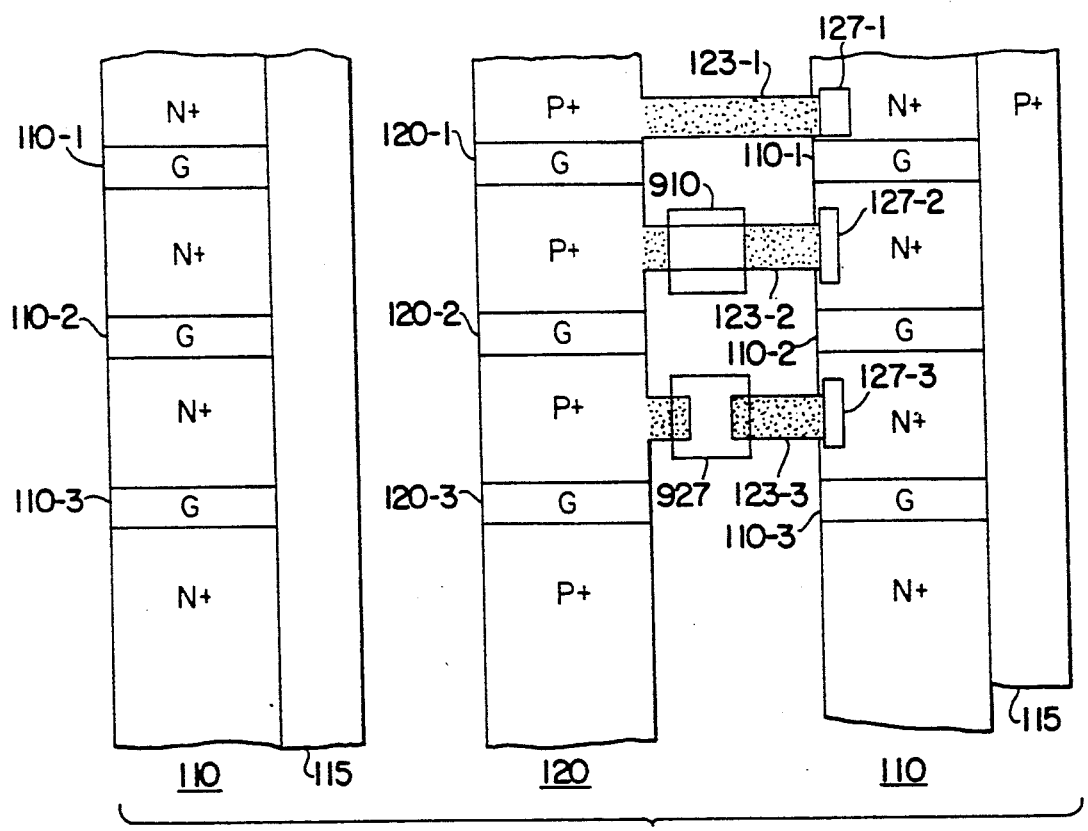
FIG. 9 illustrates a top view of a portion of a gate array constructed according to the invention.

Referring now to FIG. 9, there is a top view of a portion of a gate array constructed according to the invention. On the right-hand of the Figure there is a pair of columns 120, having P-channel transistors, and 110, having N-channel transistors. On the left there is the adjacent channel 110. The N-channel transistors have a buried body tie denoted by the numeral 115 extending out from under the gates or transistors 1101, 110-2, etc. This buried layer 115 makes contact to ground in any convenient place, such as that indicated by the dotted box 107. This box 107 may be an aperture cut through the field oxide that will be contacted with the ground connection that is distributed around the circuit.

On the right of the drawing, there is a buried body tie 115 as before and a set of interconnections 123-n between columns 120 and 110 as described with respect to FIGS. 7 and 8. Since the inverter is the basic building block of CMOS integrated circuits, it is convenient to set up the connections to form inverters. A buried body connector 123-1 is shown at the top on the right hand side. This connector has a silicide strap 127-1 that connects the N-channel transistor 110-1 with the P-channel transistor 120-I as described with respect to FIGS. 7 and 8. Variations on the connector are illustrated in the other two transistor pairs in the drawing. With respect to the middle pair, buried connector 123-2 has an aperture 910 cut through the oxide, leaving two spatially separated silicon stubs. The doping to form the doped connector 123-2 extends only partially across the interval between the two columns leaving an area that is undoped (and therefore, within the tolerance suitable for the circuit, not a connector) open to subsequent implants. If it is desired to make this connection and establish an inverter between these transistors, then the aperture 910 is implanted with the heavy implant dose required to establish a satisfactory connection or is silicided. If the inverter is not wanted, the area may be left undoped or the portion of the connector 123-2 may be etched away by a conventional silicon etchant. The terminology used here is that the buried body tie will be considered to be a conductor when its resistance is less than some threshold resistance that will depend on the details of the process. Referring to the bottom pair of transistors, there is shown another alternative in which the tie 123-3 has been formed as two stubs with an opening between them and another aperture 927 has been cut through the field oxide. This transistor pair will normally not be an inverter because the strap 123-2 is incomplete. If it is desired to set up a connection, then a short circuit may be established between the two stubs. For example, polysilicon may be allowed to penetrate aperture 927 and establish a connection between the two stubs in the personalization step. Alternatively, the connection may be established in the first level of metal connectors (Metal 1) in which the aperture is covered during the polysilicon step and is exposed during the metalization steps. Alternatively, salicide may be used to define the low resistivity connections by etching apertures down to the necessary buried body tie structures prior to refractory metal deposition and subsequent silicide formation. Those skilled in the art will readily appreciate the different methods of breaking or making the connection that may be used. An advantage of this configuration is that the opening between column 120 and 110 may be used in any of the personalization steps that take place after the contacts have been made or cut as desired. With this version of the invention, the buried connector is the lowest personalization level.

Although P-channel transistors do not have the problem of stray holes, they may also benefit from body ties for a different reason. FIG. 11 shows a P-channel transistor 805 having P+source 810, P+ drain 820 and P− channel region 850 below gate 840 and gate insulator 830. Buried body tie 860 lies below channel 850 and extends perpendicular to the plane of the paper to make contact with a +5 V power supply. In operation, source 810 is maintained at +5 V, drain 820 is maintained at 0 V and gate 840 is switched between +5 V and 0 V. Since the substrate on a CMOS circuit is conventionally held at 0 V, $V_{sb}$ will be −5 V without the presence of tie 860. With that voltage difference, the lower edge of the transistor body, at the interface with oxide 10, can be accumulated in the illustrated process having no true N-well or inverted in a conventional N-well process; so that a parasitic transistor can be formed. With the shielding effect of tie 860, $V_{sb}$ is effectively 0 and the danger of a parasitic transistor is removed. The doping of area 850 is net P− and that of area 860 is net N−.

With the process described, the simulated snapback voltage for a 5 μm device having two body ties is above 7.0 V and is below 5.5 V for widths greater than 10 μm. If desired, a second buried body tie 117 can be added at the opposite end of the channel in order to improve the snapback performance, as shown in FIG. 6. A further advantage of the invention is that the field insulator is thicker than in the prior art SOI circuits, resulting in a lower electric field in the field area.

A benefit of the three nitride process illustrated is that the thickness of the N-channel devices, P-channel devices, and buried body tie can be set independently. The thickness of the P-channel mesas is set in the first silicon removal step, while the thickness of the buried connector is set in the second silicon removal step. The first removal step can also be used to adjust the thickness of a subset of mesas to a value appropriate to form fully depleted transistors while the mesas with the standard thickness are partially depleted. If that is not necessary for some application, some processing time may be saved by using step is continued until the oxide meets the buried layer and the third LOCOS and nitride steps are omitted. In that case the thickness of the buried body tie is determined by the relative thicknesses of the mesas and the extent of the second LOCOS oxidation.

Figure 12:
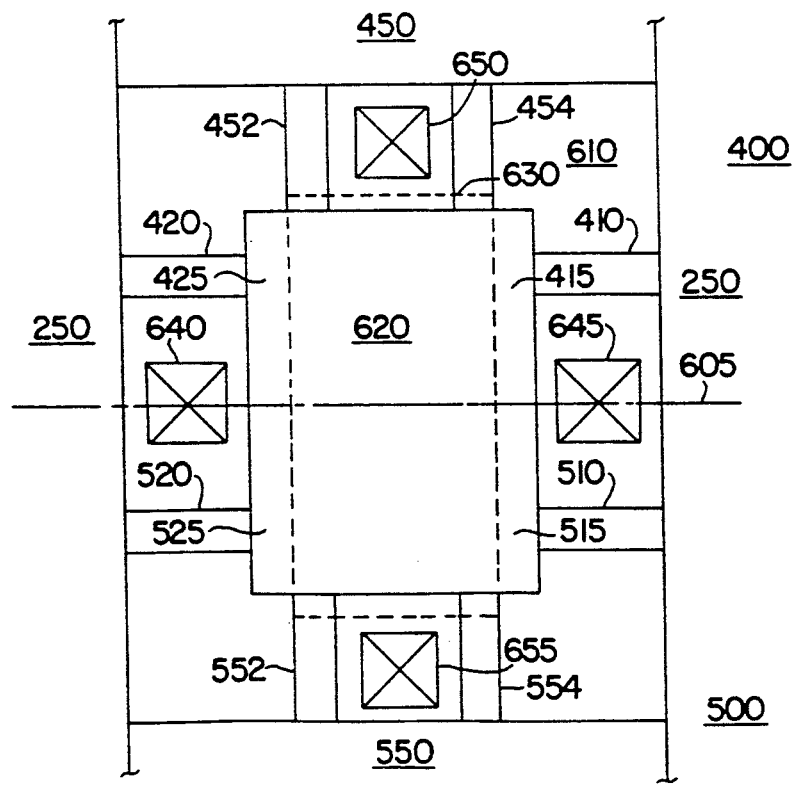
FIG. 12 illustrates a portion of an SRAM cell using the invention.

Referring now to FIG. 12, there is shown a portion of an SRAM circuit. Axis 605 denotes the separation between two cells 400 and 500. Contacts 640 and 645 are the bit and bitbar connections to the cells. Pass transistors 410 and 420, denoted by their gate regions, perform the usual function of establishing communication with the cells. Pulldown transistors 452 and 454, on either side of ground contact 650, are part of the cell and are not relevant for this discussion. The various transistors are formed in a common mesa, denoted by the numeral 610, in the form of a hollow rectangle. Areas 250 on either side of mesa 610 are field isolation constructed according to the invention. In the center of rectangle 610, the rectangular area 620 is an extensive buried body tie formed according to the invention, with the central dotted box indicating the extent of the heavy P-type implant. The bodies of pass transistors 410, 420, 510, and 520 are all connected to buried body tie 620 with sidewall implants 415, 425, 515, and 525, formed as described with respect to FIG. 6. Area 630 denotes the silicided area shorting out the junction between the P+ buried body tie and the N+ source area of transistors 452 and 454. Since contacts 650 and 655 are at ground, holes from the pass transistors can travel through buried body tie 620 to ground. A counterpart connection is formed with contact 655 at the bottom of the Figure. This Figure illustrates the space-saving aspect of the invention compared with prior art techniques, since no space has been sacrificed to form the buried body tie and its connections.

Those skilled in the art will appreciate that the process may be used to form both fully and partially depleted transistors (of both polarities) with the same implant masks. The terminology used here is that a transistor is fully depleted when the depletion region extends down to the buried insulator layer. For the same gate voltage and implants, full depletion will require a thinner mesa than partial depletion. The mask for the first silicon removal step is the process may be made to expose selected mesa sites and the amount of silicon removed may be set to result in the appropriate final mesa thickness for a fully depleted transistor. Thus, the need for a separate implant or a separate etching step to establish fully depleted and partially depleted transistors is eliminated.

TABLE I

| STEP | Comment | Parameter |
| --- | --- | --- |
| pad oxide | | 400–600 Å |
| pad nitride 1 | | 1500 Å |
| etch | expose one type of mesa and field | |
| thin-out oxide | silicon consumption to set differential mesa thickness | LOCOS 1300 Å |
| pad oxide | | 400–600 Å |
| pad nitride 2 | | 1500 Å |
| etch nitride 2 | expose area for mesa isolation | |
| oxidize buried body tie | silicon consumption to set buried body tie thickness | |
| dep buffer | deposit poly or oxide buffer layer between nitride 2 and nitride 3 | |
| pad nitride 3 | | 1500 Å |
| etch | expose field isolation | |
| oxidize | field oxide | 2800 Å total |
| sacrificial oxide | | 150 Å |
| $V_{tn}$ adjust (p-well) | N-channel implant | $1.2 \times 10^{13}$ B at 55 keV |
| $V_{tp}$ adjust (n-well) | P-channel implant | $7 \times 10^{11}$ B at 25 keV |
| buried body tie P+ dose | Outside transistor | $1 \times 10^{16}$ B at 75 keV |
| sidewall implant | Suppress parasitic transistors in P-well sidewalls | $3 \times 10^{13}$ B at 60 keV, $2 \times 10^{13}$ B at 80 keV |
| anneal | 60 minutes at 900° C., with 10 min ramp up | |

TABLE I-continued

| STEP | Comment | Parameter |
| --- | --- | --- |
| gate oxide | from and down to 850° C. Conventional low thermal budget | 200 Å |
| Conventional steps | Complete circuit | |

We claim:

1. A method of manufacturing a CMOS integrated circuit having a plurality of N-channel and P-channel transistors formed in a silicon device layer, having a silicon device layer thickness and positioned above an underlying insulating layer, comprising the steps of:

defining a set of mesa areas having a mesa top surface in said silicon layer;

isolating said set of mesa areas from one another to form a set of mesas separated by a field area;

forming said plurality of N-channel and P-channel transistors in said set of mesas; and connecting said plurality of N-channel and P-channel transistors to form an integrated circuit, characterized in that:

a first silicon removal step removes a predetermined thickness of silicon from a first removal area;

said first silicon removal step is followed by a step of performing a second silicon removal step in said field area overlapping said first silicon removal area, said second silicon removal step forming an isolation area in said silicon layer extending down toward said underlying insulator layer in said isolation area and extending down to a buried silicon connector in a buried connector area within said field area, thereby forming a buried silicon connector layer having a connector top surface below said mesa top surface in said buried connector area that is within said field area and outside said isolation area;

covering said buried connector area with a field insulation layer; and doping said buried connection layer with a predetermined dopant to establish a predetermined buried layer conductivity in at least one connector area between at least two elements or said integrated circuit.

2. A method according to claim 1, further characterized in that said second silicon removal step is continued until reaching said underlying insulating layer in said isolation area, whereby said buried connector layer has a buried connector thickness dependent on said silicon device layer thickness and on said first mesa thickness.

3. A method according to claim 1, further characterized in that said second silicon removal step is continued until a desired buried connector thickness is established; and said second silicon removal step is followed by a third silicon removal step, in which silicon is removed from said isolation area while said buried connector area is protected, whereby said buried connector thickness is established independently of said first mesa thickness.

4. A method according to claim 1, in which said first silicon removal step includes at least some of said mesa areas, whereby mesas in said first silicon removal area have a first mesa thickness that is less than said silicon layer thickness.

5. A method according to any of claims 1, 2, 3, or 4, further characterized in that;

said first silicon removal step is an etching step and said second silicon removal step and said step of covering said buried connector with a field insulator are effected by a LOCOS step that converts silicon to an oxide field insulator.

6. A method according to any of claims 1, 2, 3, or 4, further characterized in that:

said first and second silicon removal steps are both effected by first and second LOCOS steps, with an intermediate oxide removal step to remove oxide produced by said first LOCOS step.

7. A method of manufacturing an integrated circuit having a plurality of N-channel transistors formed in a silicon device layer, having a silicon device layer thickness and positioned above an underlying insulating layer, comprising the steps of:

defining a plurality of mesa areas having a mesa top surface in said silicon layer;

isolating said plurality of said mesa areas from one another to form a plurality of mesas separated by a field area;

forming said plurality of N-channel transistors in a corresponding plurality of mesas; and connecting said plurality of N-channel transistors to form an integrated circuit, characterized in that:

a first silicon removal step removes a predetermined thickness of silicon from an isolation area within said field area, whereby said silicon layer has a first thickness in said isolation area that is less than said silicon layer thickness;

said first silicon removal step is followed by a step of performing a second silicon removal step in said field area overlapping said isolation area, said second silicon removal step forming a final field area in said silicon layer extending down to said underlying insulator layer in said isolation area and extending down to a buried silicon connector in a buried connector area within said field area, thereby forming a buried silicon connection layer having a connector top surface below said mesa top surface in a buried connection area that is within said field area and outside said isolation area;

covering said buried connector area with a field insulation layer; and doping said buried connection layer with a predetermined dopant to establish a predetermined buried layer conductivity in at least one connector area between at least two elements of said integrated circuit.

8. A method according to claim 7, further characterized in that;

said first silicon removal step is an etching step and said second silicon removal step and said step of covering said buried connector with a field insulator are effected by a LOCOS step that converts silicon to an oxide field insulator.

9. A method according to claim 7, further characterized in that:

said first and second silicon removal steps are both effected by first and second LOCOS steps, with an intermediate oxide removal step to remove oxide produced by said first LOCOS step.

10. A method according to claim 7, further characterized in that said second silicon removal step is continued until reaching said underlying insulating layer in said isolation area, whereby said buried connection layer has a buried connector thickness dependent on said silicon device layer thickness and on said first mesa thickness.

11. A method according to claim 7, further characterized in that said second silicon removal step is continued until a desired buried connector thickness is established; and said second silicon removal step is followed by a third silicon removal step, in which silicon is removed from said isolation area while said buried connector area is protected, whereby said buried connector thickness is established independently of said first mesa thickness.

12. A method according to claim 7, further characterized in that said first silicon removal step removes a predetermined thickness of silicon from a subset of said mesa areas, whereby said plurality of mesa areas comprise mesas of a first mesa thickness and a second mesa thickness, said second mesa thickness being less than said first mesa thickness and related to said first mesa thickness such that transistors formed in mesas having said second mesa thickness are fully depleted while transistors formed in mesas having said first mesa thickness are partially depleted.

13. A method of manufacturing an integrated circuit having a plurality of N-channel transistors formed in a silicon device layer, having a silicon device layer thickness, positioned above an underlying insulating layer comprising the steps of:

defining a plurality of mesa areas in said silicon layer;

performing a first LOCOS oxidation of a first area separating a plurality of said mesas from one another;

forming said plurality of N-channel transistors in a corresponding plurality of mesas; and connecting said plurality of N-channel transistors to form an integrated circuit, characterized in that:

said first LOCOS oxidation step forms a first field oxide layer having a first field oxide depth;

said step of performing a first LOCOS oxidation is followed by a removal step of removing said first field oxide layer, whereby said silicon layer has a first thickness in said first field area that is less than said silicon layer thickness;

said removal step is followed by a step of performing a second LOCOS oxidation step in a field area overlapping said first field area, said second LOCOS oxidation step forming a final field oxide layer that extends through said silicon layer down to said underlying insulator layer in said first field area and extends to a buried silicon connector in a buried connector area, whereby said final field oxide layer covers a buried silicon connection layer in a buried connection area that is within said field area and outside said first field area; and said buried connection layer is doped with a predetermined dopant to establish a predetermined buried layer conductivity in at least one connector area between at least two elements of said integrated circuit.

14. A method according to claim 13, further characterized in that said first silicon removal step removes a predetermined thickness of silicon from a subset of said mesa areas, whereby said plurality of mesa areas comprise mesas of a first mesa thickness and a second mesa thickness, said second mesa thickness being less than said first mesa thickness and related to said first mesa thickness such that transistors formed in mesas having said second mesa thickness are fully depleted.

15. A method of manufacturing a silicon on insulator integrated circuit having a plurality of N-channel transistors formed in mesas in a silicon device layer having a silicon device layer thickness, positioned above an underlying insulating layer comprising the steps of:

defining a plurality of mesa areas having a mesa top surface in said silicon layer by etching through said silicon device layer to said underlying insulating layer, thereby separating a plurality of said mesas from one another by a field area extending between said mesas;

forming said plurality of N-channel transistors in a corresponding plurality of mesas; and connecting said plurality of N-channel transistors to form an integrated circuit, characterized in that:

said step of defining said mesas comprises a step of forming a first field trench having a first field trench depth in an isolation area that is less than said field area and excludes a connector area;

said step of defining said mesas further includes a step of thinning said silicon layer in said connector area, thereby forming a buried silicon connection layer having a top surface below said mesa top surface in a buried connector area that is within said field area and outside said isolation area and forming an insulating layer above said buried silicon connection layer; and doping said buried connection layer with a predetermined dopant to establish a predetermined buried layer conductivity in at least one connector area between at least one body of one of said N-channel transistors and a voltage terminal.

16. A method according to claim 15, further characterized in that said first silicon removal step removes a predetermined thickness of silicon from a subset of said mesa areas, whereby said plurality of mesa areas comprise mesas of a first mesa thickness and a second mesa thickness, said second mesa thickness being less than said first mesa thickness and related to said first mesa thickness such that transistors formed in mesas having said second mesa thickness are fully depleted while transistors for ed in mesas having said first mesa thickness are partially depleted.

17. A method of manufacturing an SOI integrated circuit having a plurality of P-channel transistors formed in a silicon layer having a silicon layer thickness and positioned above an underlying insulating layer, comprising the steps of:

defining a plurality of mesa areas having a mesa top surface in said silicon layer by etching through said silicon layer to said underlying insulating layer, thereby separating a plurality of said mesas from one another by a field area extending between said mesas;

forming said plurality of P-channel transistors in a corresponding plurality of mesas; and connecting said plurality of P-channel transistors to form an integrated circuit, characterized in that:

said step of defining said mesas comprises a step of forming a first field trench having a first field trench depth in an isolation area that is less than said field area and excludes a connector area;

said step of defining said mesas further includes a step of thinning said silicon layer in said connector area, thereby forming a buried silicon connection layer having a top surface below said mesa top surface in a buried connector area that is within said field area and outside said isolation area and forming an insulating layer above said buried silicon connection layer; and doping said buried connection layer with a predetermined dopant to establish a predetermined buried layer conductivity in at least one connector area between at least one body of one of said N-channel transistors and a voltage terminal.

18. A method according to claim 17, further characterized in that said first silicon removal step removes a predetermined thickness of silicon from a subset of said mesa areas, whereby said plurality of mesa areas comprise mesas of a first mesa thickness and a second mesa thickness, said second mesa thickness being less than said first mesa thickness and related to said first mesa thickness such that transistors formed in mesas having said second mesa thickness are fully depleted while transistors formed in mesas having said first mesa thickness are partially depleted.

* * * * *